(12) United States Patent
Pruvost

(10) Patent No.: US 7,263,339 B2
(45) Date of Patent: Aug. 28, 2007

(54) TUNER COMPRISING A VOLTAGE CONVERTER

(75) Inventor: Xavier Pruvost, Bretteville L'Orgueilleuse (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/291,036

(22) Filed: Nov. 8, 2002

(65) Prior Publication Data

US 2003/0092409 A1     May 15, 2003

(30) Foreign Application Priority Data

Nov. 13, 2001   (FR) ................................... 01 14667

(51) Int. Cl.
*H04B 1/26* (2006.01)

(52) U.S. Cl. .............................. 455/196.1; 455/197.2; 455/198.1; 455/258; 331/34; 334/15

(58) Field of Classification Search ................ 455/258, 455/255, 259, 192.3, 195.1, 196.1, 197.3, 455/198.1, 264, 179.1, 180.3, 180.4; 331/34, 331/12, 18; 334/78, 15

See application file for complete search history.

(56) References Cited

U.S. PATENT DOCUMENTS

| | | | | |
|---|---|---|---|---|
| 4,365,348 A | * | 12/1982 | Fujimoto | 455/180.4 |
| 4,713,631 A | * | 12/1987 | Enderby et al. | 331/36 C |
| 5,153,526 A | * | 10/1992 | Hori et al. | 327/113 |
| 5,742,898 A | * | 4/1998 | Brekelmans | 455/193.1 |
| 6,157,821 A | * | 12/2000 | Boesch et al. | 455/260 |
| 6,271,731 B2 | * | 8/2001 | Koszarsky | 331/36 C |

* cited by examiner

*Primary Examiner*—Edward F. Urban
*Assistant Examiner*—Blane Jackson

(57) ABSTRACT

The invention relates to a tuner for converting a radio frequency signal into an intermediate frequency signal, said tuner comprising a voltage converter supplying a control signal, a mixer associated with an oscillator which is voltage-controlled by said control signal.

The invention is characterized in that said voltage converter comprises:
  an auto-oscillating circuit generating an alternating voltage signal of a variable level,
  rectifying means for supplying a direct voltage signal of a variable level based on said alternating voltage signal of a variable level,
  an additional circuit for reducing the variations of the attenuation coefficient of said auto-oscillating circuit, said additional circuit receiving said direct voltage signal of a variable level and supplying said control signal.

The invention provides an inexpensive solution having an improved performance in terms of spectral purity, ease of implementation and stability of control of said intermediate frequency signal.

5 Claims, 3 Drawing Sheets

TUNER COMPRISING A VOLTAGE CONVERTER

The invention relates to a tuner for converting a radio frequency signal into an intermediate frequency signal, said tuner comprising a voltage converter supplying a control signal, a mixer associated with an oscillator which is voltage-controlled by said control signal.

The invention finds numerous applications in systems for receiving and demodulating radio frequency signals.

A tuner is currently used in apparatuses of the radio or television type or, more generally, in apparatuses processing modulated input signals conveying multimedia data. The tuners have the task of selecting a data signal having a given frequency from a radio frequency input signal and to convert the selected signal into an intermediate frequency output signal, notably with a view to amplification and demodulation.

FIG. 1 describes the different structural blocks of a known tuner of the prior art in U.S. Pat. No. 5,742,898.

Via the mixer 103, the tuner converts the RF input signal 101 into a IF output signal 102. The mixer 103 receives the output signal 104 which is generated by an oscillator 105, which is voltage-controlled by a control signal 106. The frequency of the output signal 104 of said oscillator depends on a nominal signal 107 applied to the tuner.

The mixer 103 multiplies the input signal 101 by said output signal 104, involving a frequency shift on the signal 101 of a value which is equal to the frequency of said signal 104.

In order that the frequency of the output signal 104 stabilizes itself, i.e. for guaranteeing the stability of the frequency of the IF signal 102, and thus the effect of the nominal signal 107, regulating means are provided. These regulating means notably comprise a comparator 110 for comparing the frequency of a reference signal 108 with a signal 111 whose frequency is a sub-multiple of the frequency of the signal 104, the value of the sub-multiple being determined by the nominal signal 107 applied to a frequency divider 109. The comparator supplies a phase shift signal 112 which is proportional to the phase shift between the signals 108 and 111, said phase shift signal being applied to a regulator 113. The regulator 113 supplies an error signal 114 to a voltage converter 115 used for generating said control signal 106.

The voltage converter 115 generates the control signal 106 whose level depends on the level of said error signal 114. In accordance with the instantaneous value of said phase shift, and hence of the error signal 114, and in order that the output signal 104 reflects the value of the nominal signal 107, the level of the control signal 106 is modified so as to vary the frequency of the output signal 104 until said phase shift becomes zero. Such a voltage converter provides the possibility of supplying control voltages whose level typically varies between 0 and 30 volts in a DC source 116 of several volts.

The tuner described in the prior-art document has a certain number of limitations.

To be able to supply control voltages in such a range, the voltage converter particularly comprises means for generating an alternating voltage signal of a variable level. Said means for generating an alternating signal are composed of a digital oscillator generating a digital signal having a parameter-suitable frequency and amplitude. The digital signal is converted by means of a D/A converter for generating said alternating voltage signal of a variable level via a transformer. Said alternating voltage signal is subsequently rectified via rectifying means so as to obtain the control signal 106. The means for generating said control voltage from a DC voltage source of several volts are expensive, which is a severe limitation within the scope of consumer applications.

It is an object of the invention to provide a tuner using a low-cost voltage converter and having a great operating stability.

To this end, the tuner is characterized in that the voltage converter comprises:
  an auto-oscillating circuit generating an alternating voltage signal of a variable level,
  rectifying means for supplying a direct voltage signal of a variable level based on said alternating voltage signal of a variable level,
  an additional circuit for reducing the variations of the attenuation coefficient of said auto-oscillating circuit, said additional circuit receiving said direct voltage signal of a variable level and supplying said control signal.

The implementation of an auto-oscillating circuit as a generator of an alternating voltage signal is less costly because it requires only one transistor and several passive components. The auto-oscillating circuit is a resonant circuit generating an alternating voltage signal which is rectified by means of a rectifier bridge.

The voltage converter supplies a current of constant level via said rectifying means and its load impedance varies within a large range to the extent that the level of the DC voltage signal may assume values of between 0 and 30 volts. This variation of the load impedance involves a modification of the damping factor of the auto-oscillating circuit if nothing is provided. The additional circuit allows a considerable reduction of the variations of the attenuation coefficient of the auto-oscillating circuit when the level of the DC signal varies. In this way, the attenuation of the auto-oscillating circuit remains at a low level. The operation of the auto-oscillating circuit will be greatly independent of the level of the DC voltage signal. This solution thus leads to a greater stability of operation.

Moreover, it will be easy to dimension the elements of such a voltage converter in order that it operates within the linear regime because the load impedance variations have only little influence on its operation. In contrast to a non-linear regime, an additional advantage as compared with the elements of the tuner operating in a linear regime is that the generation of harmonics or of parasitic signals in the tuner is avoided so that an IF signal having an "unpolluted" frequency spectrum is ensured.

The invention is also characterized in that the additional circuit comprises regulating means for subjecting the phase of said intermediate frequency signal to a nominal signal, and the current supplied by said voltage converter to a reference value, said voltage converter comprising means for varying the level of said control signal as a function of an error signal generated by the control loop.

Due to its characteristics allowing control of the DC voltage signal which it generates, the voltage converter can thus be easily integrated so as to ensure the phase and frequency stability of the IF signal.

The invention is also characterized in that the tuner comprises the additional circuit which is composed of a low-pass filter arranged in series with a resistor.

This constitutes an economical solution as regards the problem of reducing variations of the attenuation coefficient of the oscillating circuit.

The invention also relates to an apparatus of the set-top box type, as well as a TV set, which implement a tuner having the characteristic feature described above and allowing the conversion of an RF signal into an IF signal.

These and other aspects of the invention are apparent from and will be elucidated, by way of non-limitative example, with reference to the embodiment(s) described hereinafter.

Figure 1:
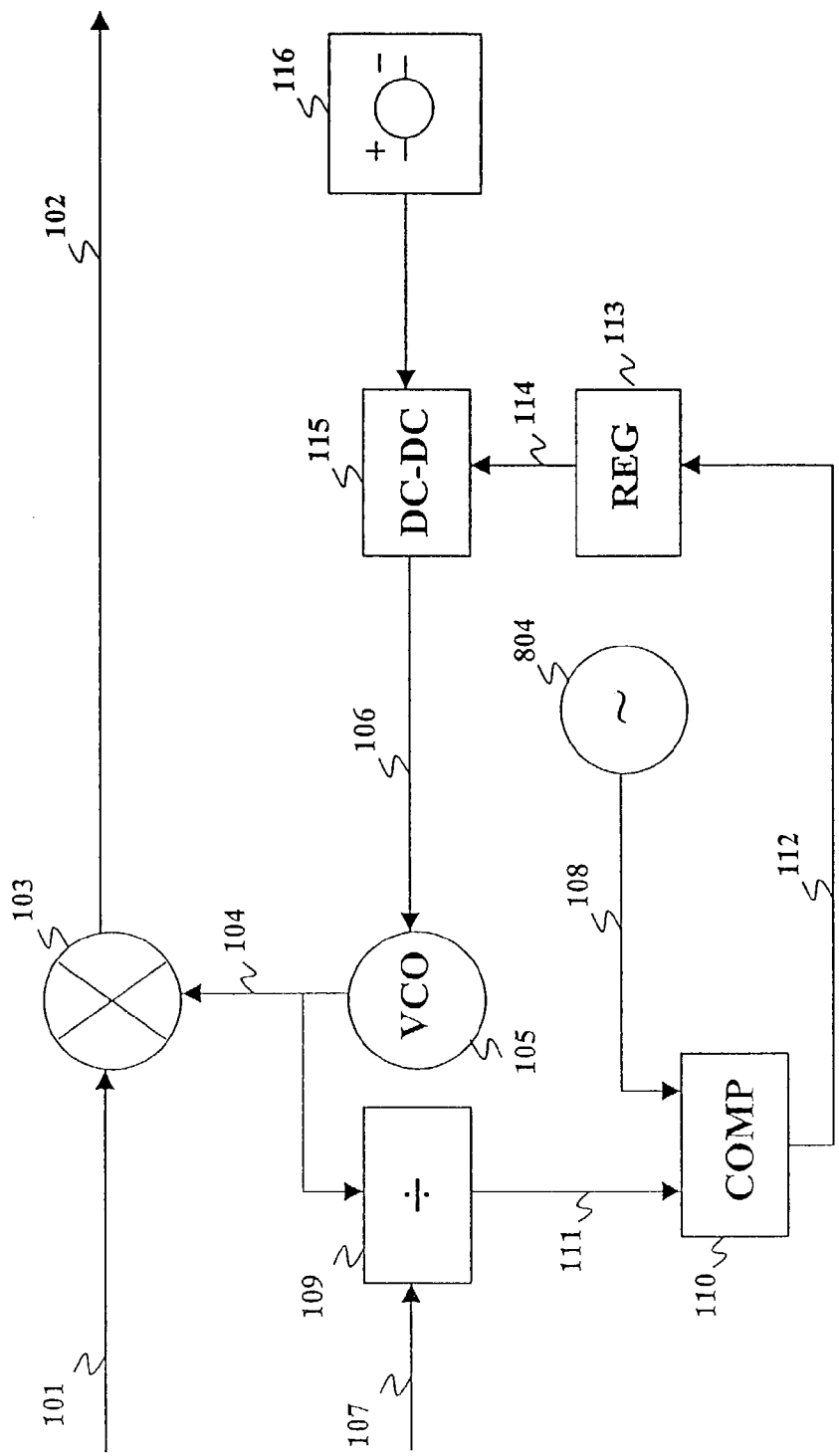
FIG. 1 is a circuit diagram of a tuner.
Figure 2:
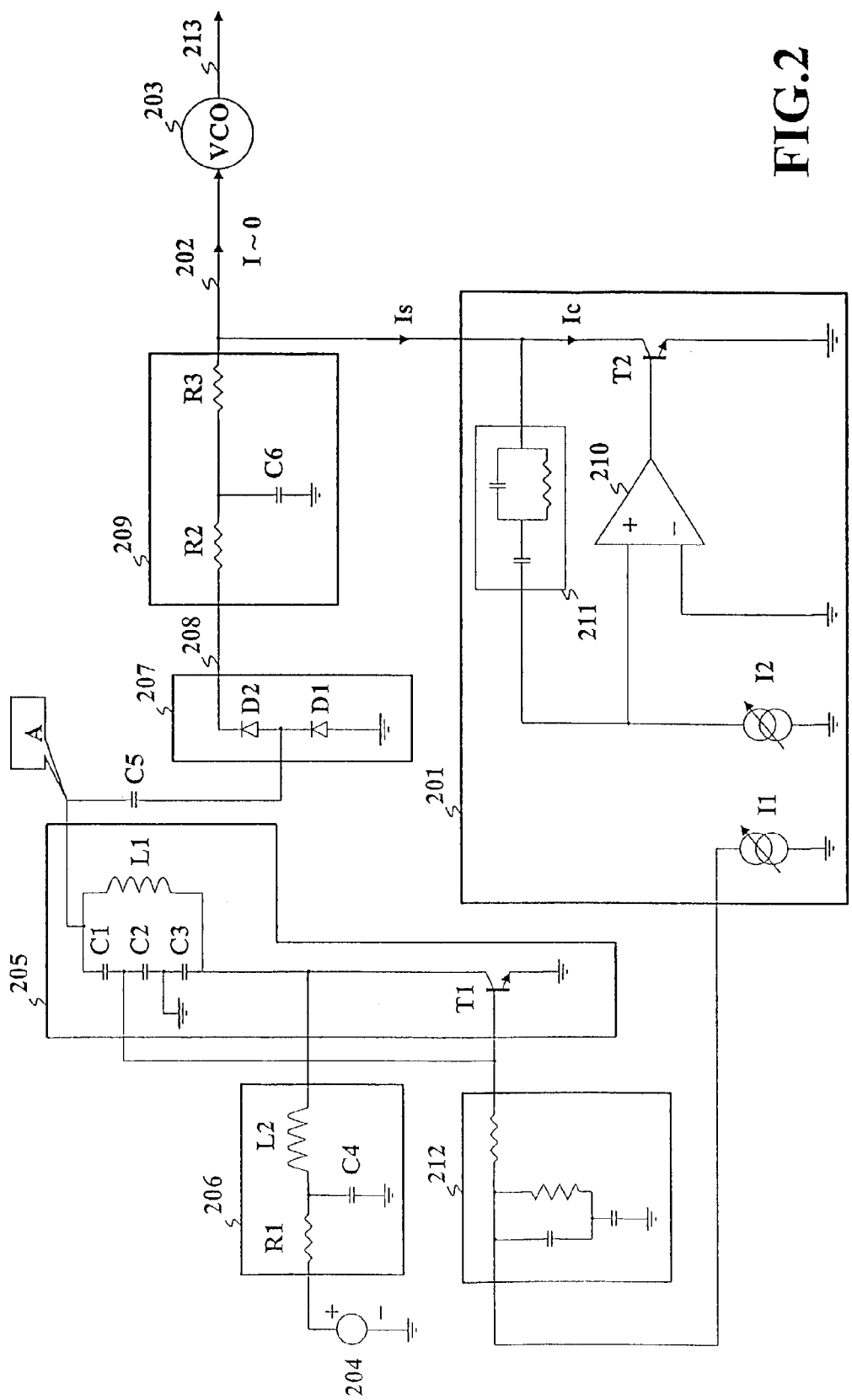
FIG. 2 shows an embodiment of a tuner according to the invention.

FIG. 2 shows an embodiment of a tuner according to the invention. Its general operating principle is similar to that described with reference to FIG. 1. For reasons of clarity, only the characteristic elements of the invention are shown in detail. Particularly, the regulating means 201 provide the possibility of stabilizing the phase (as well as the frequency) of the output signal from the voltage-controlled oscillator, and means for regulating the value of the current Is supplied by the voltage converter are shown diagrammatically.

The tuner according to the invention comprises a voltage converter with which a variable DC voltage signal 202, referred to as control signal, can be supplied to the voltage-controlled oscillator 203 from a DC voltage source 204 of several volts.

The voltage converter comprises an auto-oscillating circuit 205 of the Colpitts type constituted by capacitors C1-C2-C3, the inductance L1 and the transistor T1. The assembly of elements C2-C3-T1 constitutes a negative impedance enabling the resonant circuit 205 to freely oscillate. The amplitude of the oscillations is determined by the value of the current in the collector of T1, thus by the value of the current in the base of T1 to the extent where the transistor T1 functions linearly. A variation of the value of said negative resistance thus corresponds to a value of the current in the base of transistor T1, which involves a variation of the amplitude of the oscillations at the output of the auto-oscillating circuit 205 at point A. The amplitude of the oscillations at point A is larger as said negative resistance has a higher value in absolute terms. In other words, a value of the attenuation coefficient of the oscillations thus corresponds to a current value in the base of the transistor T1. The elements of the oscillating circuit are dimensioned in order that the resonance frequency of the auto-oscillating circuit is preferably of a megahertz order.

Via a circuit 206 effecting a low-pass filtering operation constituted by the cell R1-C4 and a smoothing of the current by the inductance L2, the DC voltage 204 is injected into the collector of the transistor T1. The DC voltage 204 of the order of volts (typically 5 volts) is the voltage from which the variable DC voltage signal 202 is generated via the auto-oscillating circuit 205.

Via a coupling capacitor C5, the oscillations of the auto-oscillating circuit 205 are rectified by means of the circuit 207. The circuit 207 is constituted by two diodes D1-D2 effecting a voltage shift to a higher value such that the low parts of the oscillations are reset to the zero level. A voltage signal 208 having an average value as a function of the level of the base current in the transistor T1 is thus supplied. An additional circuit 209 receives the signal 208 for supplying said voltage signal 202. This circuit is constituted by the cell R2-C6 functioning as a low-pass filter, notably for attenuating the fluctuations of the voltage signal 208. A resistor R3 enabling the load impedance of the voltage signal 208 to be limited is arranged at the output of the cell R2-C6.

With such a voltage converter, a DC voltage signal 202 whose level may vary typically between 0 and 30 volts may be obtained from a voltage source 204 having a level typically of 5 volts while generating a current Is having a value of the order of 100 μA.

In a preferred embodiment, the regulating means 201 comprise two control loops:

a first loop with which the phase of the output signal 213 of the voltage-controlled oscillator can be controlled by regulating the level of the voltage signal 202 at a constant value. To this end, means provide the possibility of supplying a current I2 which is proportional to the phase shift between a reference signal and the output signal 213 of the oscillator 203 which is voltage-controlled by the voltage signal 202. For example, these means may be of the charge pump circuit type supplying a current which is more or less high according to whether the two signals are leading or lagging in phase with respect to each other. The current I2 is injected in an active integrator circuit constituted by the comparator 210, the transistor T2 and the feedback filter 211. In the balanced state, i.e. when the two signals are in phase, the current I2 becomes zero and the current Ic in the collector of transistor T2 is quasi-identical to the current Iref of a reference current source (not shown).

a second loop for controlling the value of the current Ic at a reference current value. To this end, a current I1 which is proportional to the difference between Ic and Iref is generated and injected via a filter 212 into the base of the transistor T1. The current I1 thus constitutes an error signal. The filter 212 is a third-order filter in this case, allowing a stable regulation as well as a satisfactory rejection of the signal generated by the auto-oscillating circuit 205. The transistor T1 thus allows a variation of the amplitude of the oscillations of the auto-oscillating circuit at point A, i.e. also the amplitude of the voltage signal 202, as a function of a fraction of the current I1 injected into its base. The stability of the control loop can thus ensure the frequency stability of the output signal 213, regardless of the value of the voltage signal 202.

In the balanced state, the current Is flowing in the additional circuit 209 is equal to the current Ic and its value is quasi-equal to the current Iref of the reference current source. The level of the voltage signal 202 may typically vary between 0 and 30 volts, and the additional circuit 209 limits the variations of the load impedance of the auto-oscillating circuit 205 and thus also limits the variations of the attenuation factor of the auto-oscillating circuit 205. This limitation of the attenuation factor is all the more perceptible at low levels of the voltage signal 202. For high levels of the voltage signal 202, the additional circuit 209 in association with the rectifier circuit 207 behaves as a peak-to-peak voltage detector, while it behaves as an average voltage value detector for the low levels of the voltage signal 202.

Figure 3:
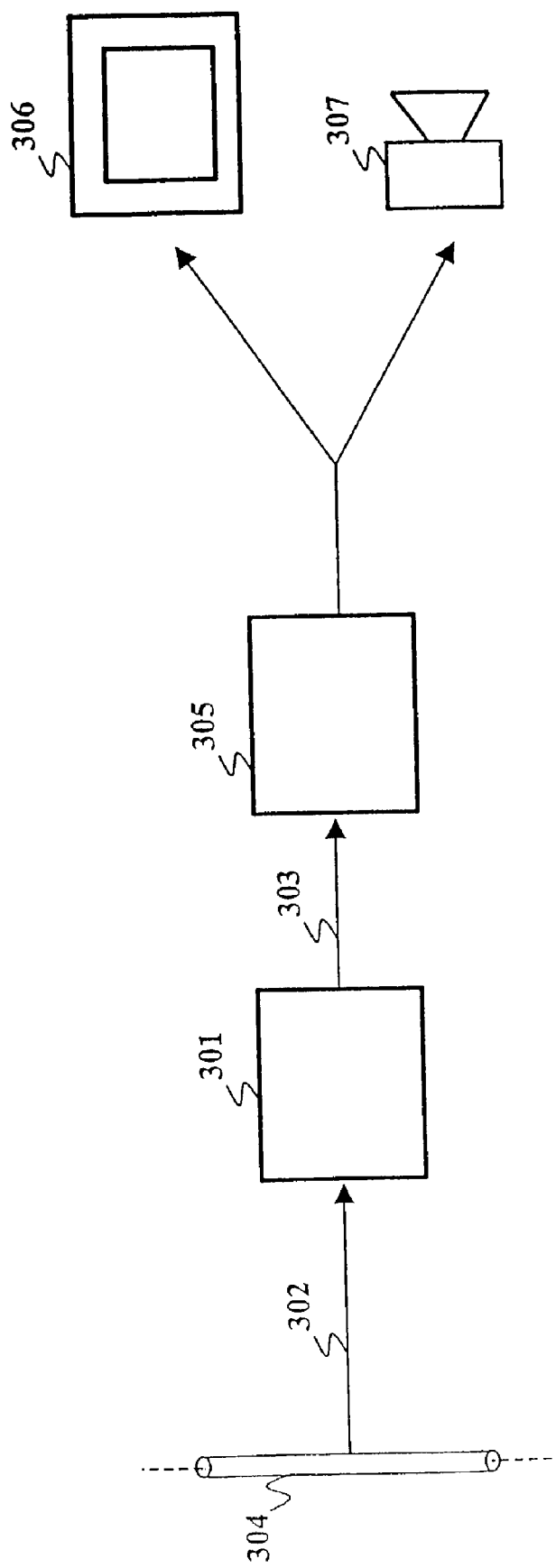
FIG. 3 illustrates an apparatus for receiving an RF signal, implementing a tuner according to the invention.

FIG. 3 illustrates an apparatus implementing a tuner 301 according to the invention, as described with reference to FIG. 2. This apparatus is dedicated to the reception of an RF signal 302 and its conversion into an IF signal 303. For example, this apparatus is of the set top box type dedicated to the reception of an RF audio-video signal 302 transmitted via a cable network 304. The IF signal 303 supplied by the tuner according to the invention is, for example, subsequently amplified and demodulated by the processing means 305 for use via display means 306 and loudspeakers 307.

The tuner according to the invention can also be implemented in a TV set.

What is claimed is:

1. A tuner for converting a radio frequency signal into an intermediate frequency signal, said tuner comprising a voltage converter supplying a control signal, a mixer associated with an oscillator which is voltage-controlled by said control signal, characterized in that said voltage converter comprises: an auto-oscillating circuit comprising a transistor biased to operate within a linear region, for generating an alternating voltage signal of a variable level in accordance with a control signal applied to the transistor; rectifying means for supplying a direct voltage signal of a variable level based on said alternating voltage signal of a variable level; and an additional circuit for reducing the variations of the attenuation coefficient of said auto-oscillating circuit, said additional circuit receiving said direct voltage signal of a variable level and supplying said control signal.

2. A tuner as claimed in claim 1, characterized in that it comprises regulating means, including a control loop, for subjecting the phase of said intermediate frequency signal to a nominal signal, and for subjecting the current supplied by said voltage converter to a reference value, said voltage converter comprising means for varying the level of said control signal as a function of an error signal generated by the control loop.

3. A tuner as claimed in claim 2, characterized in that the additional circuit comprises a low-pass filter arranged in series with a resistor.

4. A set top box for receiving a radio frequency signal, characterized in that it comprises a tuner as claimed in claim 1.

5. A TV set for receiving a radio frequency signal, characterized in that it comprises a tuner as claimed in claim 1.

* * * * *